(12) United States Patent
Fifield et al.

(10) Patent No.: US 8,300,489 B2
(45) Date of Patent: Oct. 30, 2012

(54) CHARGE PUMP SYSTEM AND METHOD UTILIZING ADJUSTABLE OUTPUT CHARGE AND COMPILATION SYSTEM AND METHOD FOR USE BY THE CHARGE PUMP

(75) Inventors: John A. Fifield, Underhill, VT (US); Thomas M. Maffitt, Burlington, VT (US); Dale E. Pontius, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 12/686,013

(22) Filed: Jan. 12, 2010

(65) Prior Publication Data

US 2011/0170368 A1 Jul. 14, 2011

(51) Int. Cl.
*G11C 7/00* (2006.01)
(52) U.S. Cl. .................. 365/226; 327/536
(58) Field of Classification Search .......... 365/226, 365/227, 229; 327/536, 589
See application file for complete search history.

(56) References Cited

U.S. PATENT DOCUMENTS

| | | | | |
|---|---|---|---|---|
| 5,491,623 A | * | 2/1996 | Jansen | 363/60 |
| 5,694,445 A | * | 12/1997 | Hirano et al. | 377/57 |
| 6,141,288 A | * | 10/2000 | Numata et al. | 365/230.03 |
| 6,680,653 B2 | | 1/2004 | Griffith et al. | |
| 6,724,241 B1 | | 4/2004 | Bedarida et al. | |
| 6,794,923 B2 | | 9/2004 | Burt et al. | |
| 6,798,275 B1 | * | 9/2004 | Le et al. | 327/536 |
| 6,903,600 B2 | | 6/2005 | Blodgett | |
| 6,989,999 B2 | * | 1/2006 | Muramatsu et al. | 363/60 |
| 7,062,738 B1 | | 6/2006 | Chu et al. | |
| 7,626,865 B2 | | 12/2009 | Ha | |
| RE42,066 E | * | 1/2011 | Svensson et al. | 363/60 |
| 2002/0170019 A1 | | 11/2002 | Hsu et al. | |

OTHER PUBLICATIONS

Nobuaki Otsuka et al. "Circuit Techniques for 1.5-V Power Supply Flash Memory" IEEE Journal of Solid-State Circuit, vol. 32, No. 8, Aug. 1997.

* cited by examiner

*Primary Examiner* — VanThu Nguyen
(74) *Attorney, Agent, or Firm* — David Cain; Roberts Mlotkowski Safran & Cole, P.C.

(57) ABSTRACT

Charge pump circuit includes a plurality of boost capacitors. An output charge of the charge pump circuit is adjusted by selecting a number of the boost capacitors at least one of using a digital control word and programming of a wiring level. A method of boosting supply voltage uses a charge pump circuit. The method includes adjusting an output charge of the charge pump circuit by selecting a number of boost capacitors at least one of using a digital control word and by programming of a wiring level.

24 Claims, 4 Drawing Sheets

VOLTAGE PUMP WITH CHARGE CONTROL

| Family/banks | Pipe | COp | Trc | Ops/nS |
|---|---|---|---|---|
| A01-A32 | 1 | 2 | 3.2 | 0.625 |
| A01-A16 | 2 | 2 | 1.6 | 1.25 |
| A17-A24 | 2 | 2 | 1.8 | 1.11 |
| A25-A32 | 2 | 2 | 2.0 | 1.00 |
| A01-A16 | 4 | 2 | 1.0 | 0.500 |
| A17-A24 | 4 | 2 | 1.2 | 1.67 |
| A25-A32 | 4 | 2 | 1.4 | 1.43 |
| F01-F16 | 1 | 2 | 2.0 | 1.00 |
| F17-F32 | 1 | 2 | 2.5 | 0.800 |
| T01-T32 | 1 | 3 | 3.2 | 0.938 |
| T01-A16 | 2 | 3 | 1.6 | 1.88 |
| T17-A24 | 2 | 3 | 1.8 | 1.67 |
| T25-A32 | 2 | 3 | 2.0 | 1.50 |

CHARGE PUMP SYSTEM AND METHOD UTILIZING ADJUSTABLE OUTPUT CHARGE AND COMPILATION SYSTEM AND METHOD FOR USE BY THE CHARGE PUMP

FIELD OF THE INVENTION

The invention relates to a charge pump system and method which utilizes a circuit whose output charge is adjusted by selection of a number of boost capacitors. The invention also relates to a compiler program usable with the circuit.

BACKGROUND

Charge pumps are used in integrated circuits to provide a boosted supply voltage in applications such as eDRAM memory, FLASH memory, bandgap voltage references, and hearing aids. Typical boost circuits first charge a capacitor from an external supply and then transfer the stored charge into a filter capacitor on a boosted supply net. A ripple voltage develops on the boosted supply net that can be minimized by large filter capacitors (dcap) and by the use of multiphase pumps.

In a 4-phase system, a voltage comparitor controls the activation of a group of 4-pumps which fire at 90-degree intervals of a clock. The charge output of a group of voltage pumps could be adjusted by enabling or disabling a number of pumps, or adjusting the number of phases used to activate the system, but as the number of phases increases, so does the number of phase dividers, boosted clock drivers and associated wiring. Regulation can be improved by deactivating excess pumps, however, charge delivery in a 4-phase system would be uneven unless groups of 4-pumps were added and subtracted as needed. An oversized dcap would also improve regulation at the expense of chip size.

In an eDRAM application, the current or charge requirement of a boosted word line (or wordline) voltage VPP does not scale linearly with supply voltage Vdd. As supply voltage Vdd drops to 0.75V (volts), for example, the charge pump system must supply nearly 100% of the current which is needed at 1.1V supply. The charge pump system must therefore be sized to provide essentially the same load current, at minimum and maximum input supply voltages.

A charge pump system can be sized to provide adequate current at low supply voltage. However, it will also typically have excessive ripple voltage unless the dcap is sized for the higher charge transfer at the maximum supply voltage. Dcap typically consumes close to 50% of the total pump area in the design and has a significant impact on chip size. A solution is therefore needed where dcap area can be reduced and charge capacity can be tailored to the load requirement.

In compilable memory systems used with charge pump systems, a charge pump system is designed for the worst case anticipated load. However, this oversized charge pump causes excessive ripple on smaller configurations having smaller loads.

Accordingly, there exists a need in the art to overcome the deficiencies and limitations described hereinabove.

SUMMARY

In a first aspect of the invention, a charge pump circuit includes a plurality of boost capacitors. An output charge of the charge pump circuit is adjusted by selecting a number of the boost capacitors where at least one of the plurality of boost caps is selected using a digital control word and programming of a wiring level.

In yet another aspect of the invention, a method of boosting supply voltage using a charge pump circuit includes adjusting an output charge of the charge pump circuit by selecting a number of boost capacitors where at least one of the plurality of boost caps is selected using a digital control word and by programming of a wiring level.

In another aspect of the invention, a computer program product comprises a computer usable storage medium having readable program code embodied in the storage medium. The computer program product is configured to set a charge level of a charge pump circuit, and includes a module that reads a number of refresh operations, an operating frequency, a number of pipe stages and banks from a user input and a module that configures a configurable charge pump to provide an optimum charge and current level to supply a regulated word line voltage to an embedded memory.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
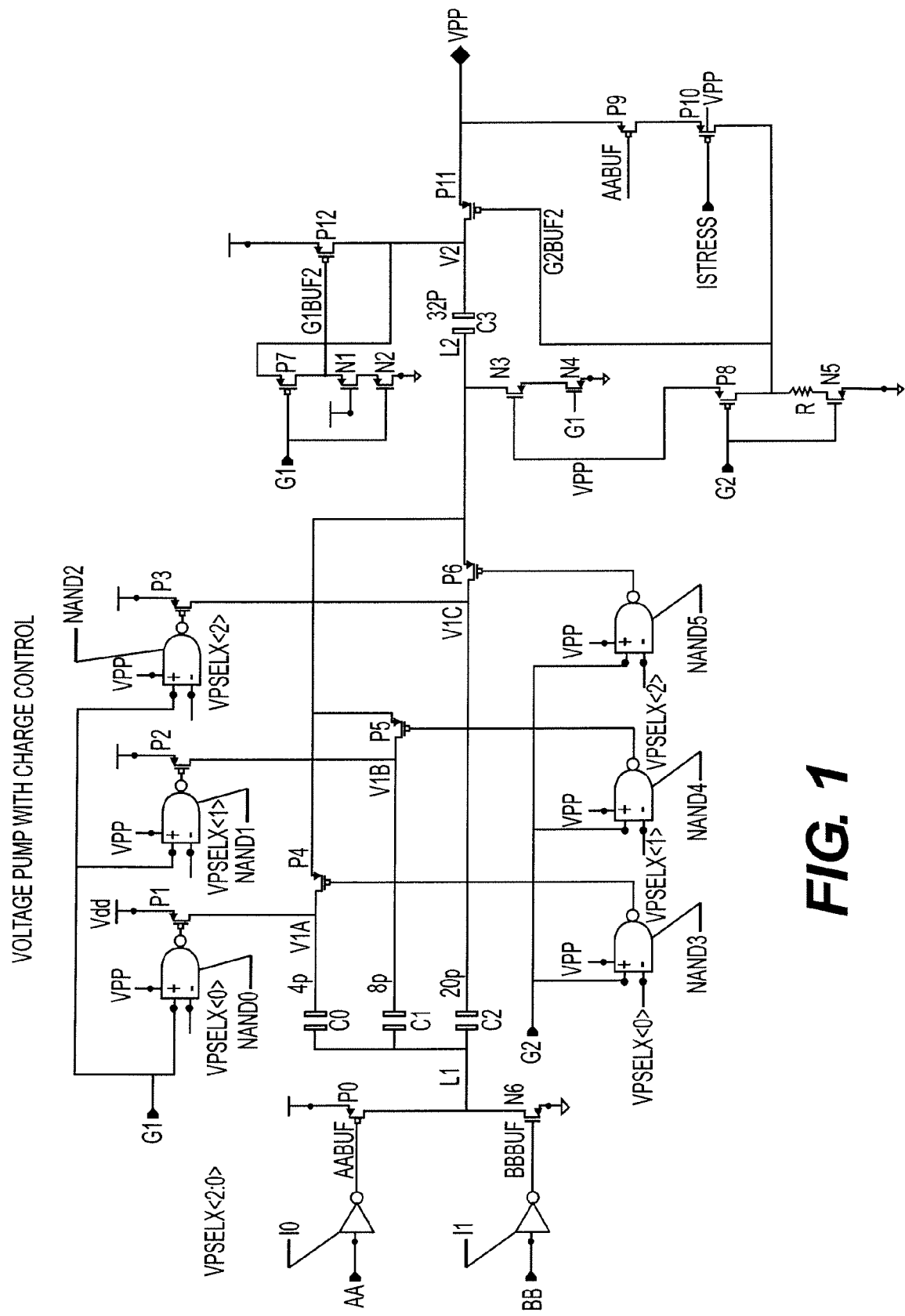
FIG. 1 shows an exemplary charge pump circuit in accordance with aspects of the invention.

The invention relates to a charge pump circuit which can include a plurality of logic selection gates, e.g., NAND devices, and a plurality of boost capacitors. An output charge of the charge pump circuit can be adjusted by selecting a number of the boost capacitors where at least one of a plurality of boost caps is selected using a digital control word or by programming of a wiring level. In embodiments, the value of a digital control word VPSELX<2:0> which provides input to logic selection gates NAND 0-5 (see FIG. 1) is determined by personalization of a wiring level. The wiring level can be adjusted for the purpose of setting certain values of the digital control word VSELX<2:0> to a logical high ('1') level or a logical low ('0') level to program how many of a plurality of boost caps will be activated. In embodiments, all boost caps capacitors may be activated by wiring all inputs to the digital control word VPSELX<2:0> to logical '1'. In further embodiments, a single boost cap capacitor of a particular capacitance value may be selected by wiring a corresponding digit of the control word to logical 1, and all other digits to logical 0. For example, in FIG. 1, VPSELX<1> could be wired to Vdd ('1') level and VPSELX<0,2,> could be wired to logical 0 to select a boost cap capacitor value of 8 pf. This customized wiring could be accomplished through selection of wiring stubs or contact levels which would establish an electrical connection between each digit of the digital control word VPSELX<2:0>and either ground level ('0'), or Vdd level ('1').

The charge pump circuit is structured and arranged to tailor a current and a charge capacity of the charge pump based on prediction of a load. The charge pump circuit can include a two-stage charge pump circuit. The two-stage charge pump circuit can produce an output boosted voltage. The two-stage charge pump circuit can include a first stage utilizing plural boost capacitors of the plurality of boost capacitors and a second stage. The plural boost capacitors can be activated and/or deactivated via a selection of the digital control word, whereby a charge capacity of the output boosted voltage is modulated.

In embodiments, the circuit can be used in combination with a memory compiler configured to calculate an anticipated charge requirement. The memory compiler may utilize information coded into a chip part number and is configured to set a charge level of the charge pump circuit.

In embodiments, the charge pump circuit is a variable-charge charge pump tailored to supply a specific predetermined charge level and provide boosted supply regulation. A load current of a pumped supply in an eDRAM application can scale with a number of wordlines activated simultaneously and scales with operating frequency.

In embodiments, the charge pump circuit includes a two-stage variable-charge charge pump utilizing first and second stages and a three-input charge control word is configured to selectively activate or deactivate select boost capacitors within the first stage. A charge stored in the first stage is determined by the digital control word.

The invention also provides for a charge pump circuit that includes a two-stage variable-charge charge pump utilizing first and second stages and a three-input charge control word configured to selectively activate or deactivate select boost capacitors within the first stage. A charge stored in the first stage is determined by a setting of a digital control word.

In embodiments, the charge stored in the first stage is transferred to the second stage for voltage tripling, and is then transferred to a boosted node dcap, whereby a ripple voltage is minimized. The circuit can further include a device configured to tailor a charge output of the charge pump circuit and to adjust a set of N-programming inputs to determine an amount of capacitance utilized by a charge pump circuit. The device may be configured to add and/or delete capacitance in a configurable charge reservoir.

In embodiments, the circuit includes at least the following operation states: a lower load state wherein a proportionally small amount of boost capacitor utilization is programmed in the charge pump circuit; and a higher load state wherein a maximum amount of boost capacitor utilization is be activated.

In embodiments, the boost capacitors are active or inactive by programming metal tabs. The circuit may utilize a digital control word to control logic gates which allow or inhibit a flow of charge from sections of a segmented boost capacitor.

In embodiments, the circuit is utilized in combination with a memory compiler configured to calculate an anticipated charge requirement, wherein the memory compiler utilizes information coded into a chip part number and is configured to set a charge level of the charge pump circuit. The invention also relates to a method of boosting supply voltage using a charge pump circuit, wherein the method includes adjusting an output charge of the charge pump circuit by selecting a number of boost capacitors at least one of using a digital control word and by programming of a wiring level.

The invention also provides for a compiler program product stored on a computer readable storage medium that is configured to utilize information coded into a chip part number and to set a charge level of a charge pump circuit. The product includes a module that reads a number of refresh operations, an operating frequency, a number of pipe stages and banks from a user input and a module that configures a configurable charge pump to provide an optimum charge and current level to supply a regulated word line voltage to an embedded memory.

The invention also provides for a method comprising reading configuration information from a control file or descriptor, calculating estimated charge requirements based on a figure of merit such as memory operations per second from the configuration information, and configuring via programmable control bit settings or metal wiring options a set of characteristics of a charge pump, such as number of stages and storage capacitance, based on the estimated charge requirements.

The invention also provides for an apparatus comprising a charge pump having an adjustable number of stages. The charge pump includes an adjustable boost capacitance. A system is also provided for adjusting the number of stages or boost capacitance.

The system may comprise metal wires that can be populated or configured when a memory macro containing the charge pump is compiled. The system may comprise binary control bits whose value can be predetermined when a memory macro is compiled.

The invention also provides for a method or circuitry for adjusting the value of the charge modulating control word VPSELX<2:0> dynamically in response to a changing boosted supply load, a change in a power supply voltage, or an operating frequency or through a change in the number of wordlines selected. The control word can be adjusted in response to a signal from a sensing system or from the output of control logic designed to sense or anticipate the load requirement on a boosted supply. In such a system, the control word and hence the charge capacity of the boosted supply can be adjusted during actual use of a product and not just at manufacturing.

As will be appreciated by one skilled in the art, the present invention may be embodied as a system, method or computer program product implementing aspects of the invention. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following:

an electrical connection having one or more wires,
a portable computer diskette,
a hard disk,
a random access memory (RAM),
a read-only memory (ROM),
an erasable programmable read-only memory (EPROM or Flash memory),
an optical fiber,
a portable compact disc read-only memory (CDROM),
an optical storage device,
a transmission media such as those supporting the Internet or an intranet, or
a magnetic storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++, Python, or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network. This may include, for example, a local area network (LAN) or a wide area network (WAN), or the connection may be made to an external computer (for example, through the Internet using an Internet Service Provider).

Figure 2:
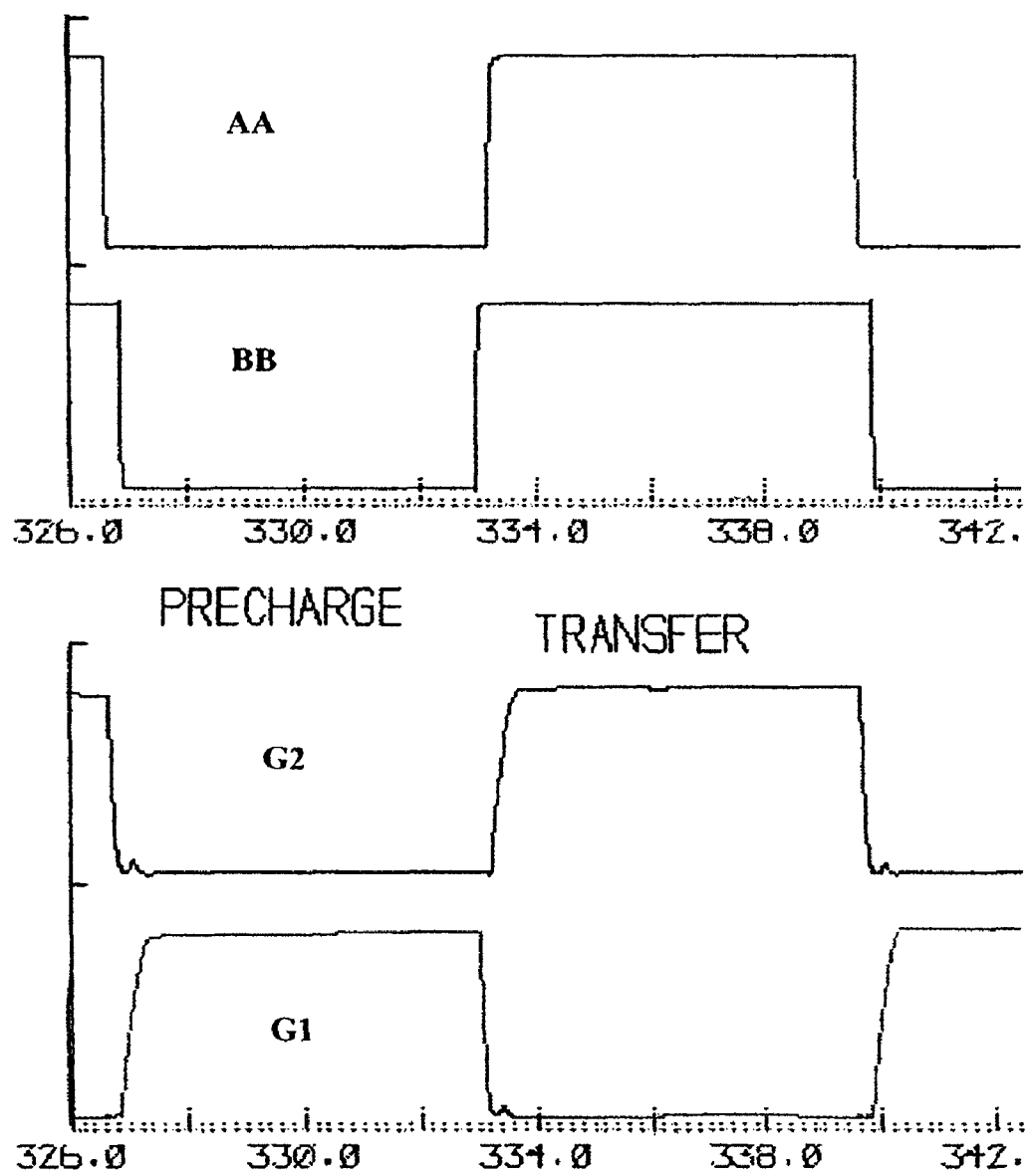
FIG. 2 shows a timing diagram of the circuit shown in FIG. 1 in accordance with aspects of the invention.

FIG. 1 shows a two-stage variable-charge charge pump having the form of a circuit. The circuit includes non-overlapping clock inputs AA, BB and G1,G2. The timing diagram of these clock inputs is shown in FIG. 2.

The first stage of the circuit shown in FIG. 1 includes a group of 3-boost capacitors C0, C1 and C2 with respective sizes of 4, 8 and 20 pf (picofarads). These capacitors C0, C1 and C2 are coupled to a common input plate node L1 and output plate nodes V1A, V1B and V1C, respectively. The circuit is powered by global power supply Vdd and each of a group of 3-PFET devices P1-P3 in the first stage is coupled to Vdd.

The first stage also includes NAND0, NAND1, NAND2, which will allow precharge of nodes V1A, V1B and V1C, respectively, in response to the setting of digital control word VPSELX<2:0>. Devices NAND3, NAND4, NAND5, are likewise used to allow boosted charge conduction through FET devices P4, P5 and P6, respectively, in response to the setting, or value of VPSELX<2:0>.

Inverters I0 and I1 receive clock signals AA and BB and provide buffered signals AABUF and BBBUF to activate precharge device N6 and lift device P0. In the precharge time, the common node L1 of boost caps C0-C2 is precharged to ground. In the transfer stage, device P0 is activated to lift common node L1 to power supply level.

The second stage of the circuit includes a 32-pf boost cap C3 and is coupled to the first stage via transfer devices which are activated by selection of a 3-input charge or digital control word VPSELX<2:0>. The second stage also includes an inverter circuit formed by devices N1, N2 and P7 which receive clock G1 and output signal G1BUF2. Signal G1BUF2 activates device P12 to precharge node V2 to the power supply level. Precharge devices N3 and N4 are activated by clock G1 to precharge node L2 to ground. An inverter circuit formed by devices P8 and N5 receives clock G2 and outputs a signal G2BUF2 which activates the output device P11 to output the boosted voltage level to node VPP. The down level of G2BUF2 is controlled by the resistor R and the current allowed to flow through current source P10. Device P9 is controlled by signal AABUF to restrict current flow into resistor R only in the transfer stage of the cycle.

In a precharge phase, the group of 3-PFET devices P1-P3 arranged in the first stage will precharge the V1A, V1B and V1C nodes in response to the 3-input charge control word VPSELX<2:0> when input G1 goes high, i.e., logic 1. In this case, the common plate node L1 will be precharged low, i.e., to ground. Also, the node V2 of the second stage is precharged high and node L2 is precharged low. At this point, a selected amount of charge Q1 is held in the first stage capacitors C0, C1 and C2.

In a transfer phase, inputs AA and BB go high, i.e., logic 1, which lifts the common plate node L1 to Vdd. Selected transfer devices P4, P5 and P6 of the first stage will transfer charge Q1 to the L2 node as input G2 goes high, i.e., logic 1. Charge is transferred through the second stage boost cap C3 and through a second stage transfer gate P11 and onto the VPP output node. The voltage gate to source on transfer gate P11 is reduced to limit oxide stress by the gate control circuit with inputs AABUF, ISTRESS and, for example, a 10K-ohm resistor R. Input ITRESS is a current control input from a current mirror (not shown but which could be derived from a bandgap reference circuit) to allow a small amount of current (e.g., 20 microamps) to pass and develop a voltage drop across the 10K-ohm resistor R, as is known in the art.

The variable-charge charge pump shown in FIG. 1 doubles the supply voltage Vdd in the first stage, and adds the supply voltage Vdd again in the second stage. It thus functions as a voltage tripler. Using the charge pump of FIG. 1, the amount of output charge can be adjusted to reduce the ripple voltage so as to prevent an over voltage condition of the boosted output node VPP.

As load current requirements increase, the digital charge control word VPSELX<2:0> can be adjusted to a higher setting in order to meet the load current requirement. A high capacity system can be configured with all boost caps enabled to provide 32-picoocoulms (pc) per volt of charge at a low power supply voltage of 0.7V to provide (32 pc/volt)×(0.7 volts)=22.4 pc of charge at each clock cycle.

If the power supply is increased to 1.12V, for example, the system can be throttled back by selecting only 20 pf of boost cap to provide an identical charge capacity as the low voltage example above. Charge capacity in this latter example is 20 pc per volt which calculates to (20 pc/volt)×(1.12 volts)=22.4 pc of charge at each clock cycle.

FIG. 2 shows exemplary timings of control signals AA, BB, G1 and G2. In the Precharge phase, signals AA, BB and G2 are low (logical '0'), and G2 is high (logical '1') to allow precharge of the selected boost capacitor elements. In the Transfer phase, the signal polarity reverses to cause charge form the selected boost capacitor elements to flow out to the boosted supply output node, Vpp in FIG. 1. Switching of the control signals is performed to generate non-overlapping edges as shown to make clean transitions between the Precharge and Transfer phases.

In integrated circuits with boosted load currents predicted by the number of active banks, or clock frequency, or other predictable factors, the first stage charge Q1 can be compiled to match the load requirements. This can be accomplished as discussed below in reference to FIG. 4.

Figure 3:
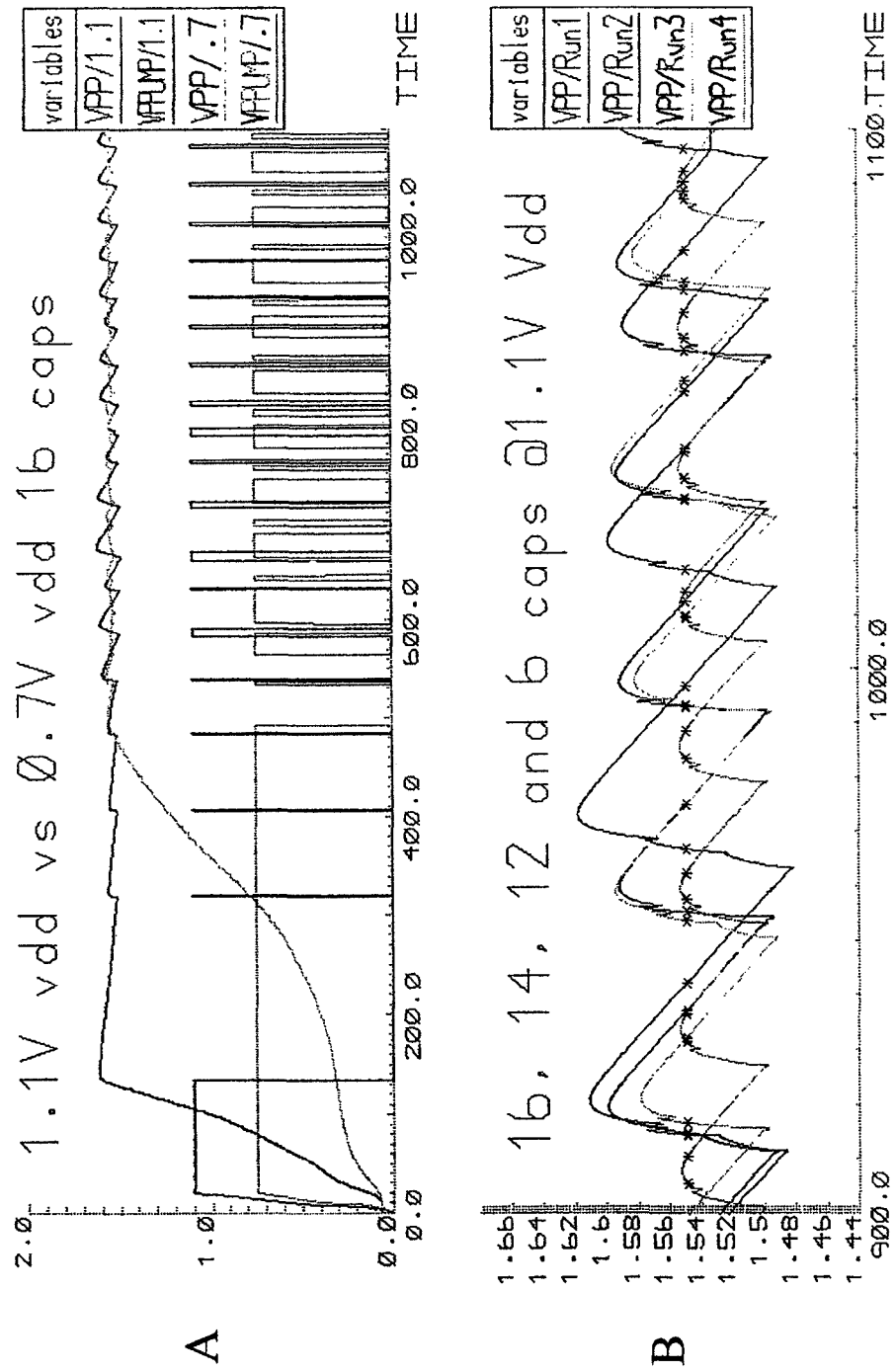
FIG. 3 shows a ripple voltage comparison at two voltage levels in accordance with aspects of the invention.

FIG. 3 illustrates how the circuit of FIG. 1 can improve ripple voltage, and hence voltage regulation. In graph "A", a system of 8-variable-charge charge pumps is supplying a 4-mA (milliamp) load. A voltage comparitor is used to switch the charge pumps on and off in order to regulate to 1.55 V, as is known in the art. When the Vdd power supply is 1.1 V, the ripple voltage is almost 200 mV (millivolts), and when Vdd is 0.7 V, ripple voltage is less than 100 mV. Graph "B" shows the reduction in ripple voltage while supplying 4-mA at Vdd of 1.1 V. The peak ripple voltage drops from about 1.62 V to very close to the regulated target of 1.55V as the charge Q1 of the first stage is reduced as the digital charge control word VPSELX<2:0> selects 32, 28, 24 and 12 picofarads of capacitance in the first stage.

As is apparent from FIGS. 1 and 3, voltage regulation is improved by adjusting the charge output through selection of bits within charge control word VPSELX<2:0> as a function of supply voltage Vdd at, by way of non-limiting example, 0.7 and 1.1 volts.

Figure 4:
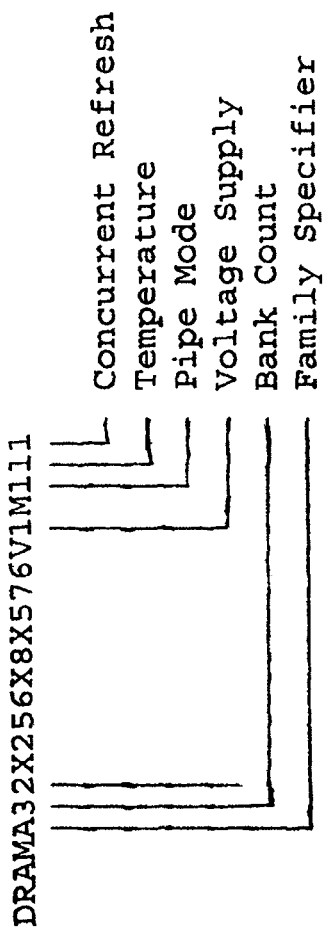
FIG. 4 shows how information from a chip part number can be utilized in a compiler program to produce a digital control word usable with the circuit of FIG. 1 in accordance with aspects of the invention.

FIG. 4 shows a table describing the fields of an integrated circuit (IC) part number. In this non-limiting example, a first section (from the left side) describes the IC as a DRAM memory with subsequent fields describing 32 banks each having a depth of 256 works and a width of 576 bits. The X8 field within the part number refers to having 8 columns per bit. The IC is further described as having a 1-volt supply and M pipe stages and temperature range 1 and having concurrent refresh.

In this DRAM-IC, memory banks may be activated to read or write data and may additionally be activated to perform a data-refresh operation to prevent leakage from erasing the data stored in the dynamic memory cells. A concurrent refresh is described as a refresh operation which occurs while a read or write cycle is being performed in another memory section.

The data fields of the DRAM part number can be used to define a figure of merit of how large the load will be on a boosted supply net. The anticipated charge is proportional to the number of operations (Ops) per unit of time (ns), or Ops/ns. For example, a fast memory cycle and a large number of operations per cycle will therefore equate to a high current load and here expressed as a high Ops/ns number.

In FIG. 4, the first column labeled Family/Banks refers to a speed sort range from A, F or T, and the number of memory banks from 1-32. The number of pipe stages are described in the second column as 1, 2 or 4, and is indicative of the clock speed with a high pipe count relating to a faster operating frequency. The Cop column describes the number of concurrent operations which may occur in one cycle. The Trc column describes the clock frequency and is a function of the Family/Banks and Pipe fields.

The table in FIG. 4 utilizes a number of banks, a number of pipe stages, a number of concurrent refreshes allowed, and cycle time (Trc) to predict an Ops/ns number which is indicative of the charge requirement on a boosted supply.

In one embodiment of a compiler, three (3) control bits can be used to control eight (8) possible charge levels. The table in FIG. 4 describes 13 possible charge or power level requirements which can, for example, be regrouped into eight (8) buckets or levels. In this approach, a particular charge capacity can be used for a range of charge capacity requirements rather than providing for 13 separate control levels. In embodiments, the compiler is a memory compiler configured to calculate an anticipated charge requirement.

In an exemplary compiler, the data from FIG. 4 is used as input to a software function to determine the digital value of a set of control bits, i.e., VPSELX<2:0> from FIG. 1, in this example. The digital value of VPSELX<2:0> is configured by an electrical connection either from ground "logical 0", or from Vdd "logical 1", for example, by way of programming metal tabs, contacts or other configurable conduction methods. The number of boost caps in FIG. 1 can thus be activated or deactivated in response to output from a software function which receives input instruction from a part number, or from a set of specifics describing memory speed and number of concurrent operations.

ASIC chips are designed with embedded macros that can be compiled using input from a file to construct a memory with a specific number of banks and a specific word width. Each bank contains multiple word lines, and when a word line is accessed, charge from a VPP pump is consumed. Word lines are activated to read and write data, and also accessed to perform a refresh operation to compensate for leakage within the cells. The charge and current required to supply a regulated VPP voltage to a plurality of memory banks is proportional to the operating frequency, and the number of wordlines simultaneously activated. A metric to describe the charge consumed in an eDRAM memory, i.e., an embedded eDRAM macro, can be expressed as the number of word line (WL) operations (OPS) per cycle times the operating frequency, or as the number of OPS per nanosecond, OPS/ns.

According to one non-limiting embodiment of the invention, a compiler can be utilized to compile an embedded DRAM for an anticipated charge requirement using information of the type shown in FIG. 4. Using the compiler, it is possible to predict the number of OPS/ns based on the part number of the eDRAM. The 23-bit fields of a coded part number can analyzed to predict the number of OPS/ns from the number of pipe stages and concurrent refresh operations and the cycle time.

Intellectual property created by integrated circuit manufacturers frequently uses the name of that IP to signify a number of key properties. For instance, an embedded DRAM macro may have indicated performance, bank depth, data width, functional mode, etc, all within the name. In the context of this invention, it is possible to parse the name of an embedded DRAM to predict its charge requirements. This information can then be used to preset a strength level for the pump and regulation system.

Once the number of OPS/ns is known, the current needed in an eDRAM memory can be predicted by multiplying the charge per WL by OPS/ns. Hence an optimum charge pump size can be predicted and the charge pumps of the eDRAM can be configured by adjustment of the VPSEL<X> bits in FIG. 1.

The circuits and methods as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A charge pump circuit comprising:
 a plurality of boost capacitors, wherein an output charge of the charge pump circuit is adjusted by selecting a number of the boost capacitors by at least one of:
  using a digital control word; and
  programming of a wiring level; and further comprising:
 a common input plate node coupled to the plurality of boost capacitors, wherein:
  in a precharge time, the common input plate node is precharged to ground; and
  in a transfer stage, the common input plate node is lifted to a power supply level.

2. The circuit of claim 1, wherein the charge pump circuit at least one of:
 comprises a plurality of logic selection gates;
 comprises a plurality of NAND devices; and
 is structured and arranged to tailor a current and a charge capacity of the charge pump based on prediction of a load.

3. The circuit of claim 1, wherein the charge pump circuit comprises a two-stage charge pump circuit.

4. The circuit of claim 3, wherein the two-stage charge pump circuit produces an output boosted voltage.

5. The circuit of claim 4, wherein the two-stage charge pump circuit comprises a first stage utilizing plural boost capacitors of the plurality of boost capacitors and a second stage.

6. The circuit of claim 5, wherein the plural boost capacitors are activated and/or deactivated via a selection of the digital control word, whereby a charge capacity of the output boosted voltage is modulated.

7. The circuit of claim 1, in combination with a memory compiler configured to calculate an anticipated charge requirement.

8. The combination of claim 7, wherein the memory compiler utilizes information at least one of:
 coded into a chip part number; and
 configured to set a charge level of the charge pump circuit.

9. The circuit of claim 1, wherein the charge pump circuit is a variable-charge charge pump tailored to supply a specific predetermined charge level and provide boosted supply regulation.

10. The circuit of claim 1, wherein an output charge of the charge pump circuit in an eDRAM application scales with a number of wordlines activated simultaneously and scales with operating frequency.

11. The circuit of claim 1, wherein the charge pump circuit comprises a two-stage variable-charge charge pump utilizing first and second stages and a charge stored in the first stage is determined by the digital control word.

12. A method of boosting supply voltage using a charge pump circuit, the method comprising:
 adjusting an output charge of the charge pump circuit by selecting a number of boost capacitors by at least one of:
 using a digital control word; and
 by programming of a wiring level,
 wherein, in a precharge phase, devices arranged in a first stage will precharge voltage nodes in response to the digital control word, when a clock signal of a second stage of the charge pump circuit goes high.

13. The method of claim 12, wherein the circuit comprises a two-stage variable-charge charge pump utilizing first and second stages and a charge control word configured to selectively activate or deactivate select boost capacitors within the first stage, and wherein the method further comprises:
 determining a charge stored in the first stage using a digital control word;
 transferring the charge stored in the first stage to the second stage for voltage tripling; and
 after the transferring, transferring the charge to a boosted node in order to minimize a ripple voltage on an output node.

14. The method of claim 12, further comprising:
 tailoring a charge output of the charge pump circuit; and
 adjusting a set of N-programming inputs to determine an amount of charge supplied by the charge pump circuit.

15. The method of claim 12, further comprising adding to and/or subtracting capacitance from the boost capacitors.

16. The method of claim 12, wherein the circuit includes at least the following operation states:
 a lower load state wherein a proportionally small amount of boost capacitor utilization is programmed in the charge pump circuit; and
 a higher load state wherein a maximum amount of boost capacitor utilization is activated.

17. The method of claim 12, further comprising activating and/or deactivating the boost capacitors by the programming of the wiring level.

18. The method of claim 12, further comprising utilizing the digital control word to control logic gates so as to allow or inhibit a flow of charge from sections of a segmented boost capacitor of the boost capacitors.

19. The method of claim 12, further comprising using a memory compiler to calculate an anticipated charge requirement of the circuit, wherein the memory compiler is configured to set a charge level of the charge pump circuit.

20. The circuit of claim 1, further comprising, in a first phase of the charge pump circuit:
 a plurality of output plate nodes corresponding to a respective boost capacitor of the plurality of boost capacitors;
 non-overlapping clock signals which are buffered by a respective inverter, the respective inverter each being coupled to the common input plate node and buffering the non-overlapping clock signals; and
 NAND gates coupled to a respective output plate node of the plurality of output plate nodes, the NAND gates each will precharge voltage nodes in response to the digital control word, when a clock signal of a second phase of the charge pump circuit goes high.

21. The circuit of claim 20, wherein the plurality of boost capacitors have different capacitances.

22. The circuit of claim 21, wherein a plurality of NAND devices allow precharging of voltage nodes in response to setting of the digital control word.

23. The circuit of claim 22, wherein the second phase includes a capacitor having a capacitance larger than the plurality of boost capacitors.

24. The method of claim 12, further comprising receiving non-overlapping clock signals which are buffered, the buffered signals activating a pre-charge device of the charge pump circuit.

\* \* \* \* \*